United States Patent
Watanabe et al.

[11] Patent Number: 5,834,982
[45] Date of Patent: Nov. 10, 1998

[54] QUICK STARTING OSCILLATOR CIRCUIT HAVING LOW POWER CONSUMPTION

[75] Inventors: Shigemitsu Watanabe; Hiromi Katoh, both of Kanagawa, Japan

[73] Assignee: Mitsumi Electric Co., Ltd., Tokyo, Japan

[21] Appl. No.: 920,731

[22] Filed: Aug. 29, 1997

[30] Foreign Application Priority Data

Aug. 29, 1996 [JP] Japan .................................... 8-228550

[51] Int. Cl.⁶ ................................ H03B 5/38; H03L 3/00
[52] U.S. Cl. ...................... 331/109; 331/116 R; 331/158; 331/183; 331/186
[58] Field of Search ................................ 331/109, 116 R, 331/116 FE, 158, 183, 185, 186

[56] References Cited

U.S. PATENT DOCUMENTS

| 4,328,571 | 5/1982 | Noble | 331/116 FE |
| 4,956,618 | 9/1990 | Ulmer | 331/116 FE |

*Primary Examiner*—Siegfried H. Grimm
*Attorney, Agent, or Firm*—Frishauf, Holtz, Goodman, Langer & Chick

[57] ABSTRACT

Supplied with a power source, an output level of an oscillating circuit gradually increases until the oscillator circuit reaches its steady oscillation. A level monitor monitors the output level, and produces a control signal if the output level is less than a predetermined level. A current producing circuit receives the control signal and produces a boost current to increase a collector current at an oscillating transistor. The output level of the oscillating circuit suddenly increases as the collector current increases. After the output level of the oscillator reaches the predetermined level, the level monitor stops production of the control signal. Therefore, the boost current stops. As a result, the collector current of the oscillating transistor has a predetermined value dependent on the circuit structure of the oscillating circuit. Thus, only before the output level reaches the predetermined level, the collector current of the oscillating transistor is brought to an increased level, and after the output level reaches the predetermined level, the value of the collector current is decreased to a predetermined value. Therefore, the oscillator starts quickly, suppressing the increase of the power consumption even when the oscillator is intermittently driven.

7 Claims, 6 Drawing Sheets

QUICK STARTING OSCILLATOR CIRCUIT HAVING LOW POWER CONSUMPTION

BACKGROUND OF THE INVENTION

This invention relates to an oscillator and, in particular, to an oscillator which can reduce a starting time of oscillation.

An oscillator comprises, as a main component, an oscillating circuit which has an oscillating transistor.

As a well-known oscillating circuit, there is a kind of Barkhausen-type oscillating circuit such as a Colpitts-type oscillating circuit, especially a Colpitts-type crystal oscillating circuit. The Barkhausen-type oscillating circuit comprises three reactance elements and an oscillating transistor. In particular, the Colpitts-type oscillating circuit has a capacitive reactance between a collector and an emitter of the oscillating transistor, another capacitive reactance between a base of the oscillating transistor and the emitter, and an inductive reactance between the collector and the base. Moreover, the Colpitts-type crystal oscillating circuit is a Colpitts-type oscillating circuit whose inductive reactance is replaced with a crystal resonator. The Colpitts-type crystal oscillating circuit can produce a signal having a very stable frequency.

In recent years, an oscillator having such an oscillating circuit as this crystal oscillating circuit is loaded on a mobile wireless phone as a unit to produce a reference clock. For instance, there is a battery-driven mobile wireless phone such as a digital cellular phone.

As a mobile wireless phone, it is required for an oscillator to have a quick starting characteristic. Generally, a mobile wireless phone is designed to intermittently operate circuits of the wireless phone so as to reduce the power consumption. The oscillator is one of circuits constituting the wireless phone and, therefore, any circuit constituting the oscillator is also operated intermittently. If much time is required until an output of the oscillator stabilizes, this results in that each intermittent operation requires the stabilizing time. Such situation is undesirable in view of convenient use. Therefore, it is necessary for the oscillator to possess a quick starting characteristic.

However, an improvement of the starting characteristic of the oscillator causes a problem that the power consumption of the mobile wireless phone is increased. This is because a collector current of the oscillating transistor must be set up to a large value in order to improve the starting characteristic of the oscillator. The setting up the collector current of the oscillating transistor to the large value inevitably increases the power consumption. In a battery-driven mobile wireless phone, for example, this results in a short battery life as compared with the case where a collector current is small.

Thus, for example, a battery-driven mobile wireless phone loaded with a conventional crystal oscillator has a problem of a trade-off relationship between the reduction of the power consumption and the quick starting characteristic required for the oscillating circuit.

SUMMARY OF THE INVENTION

It is an object of this invention to provide an oscillator which has a quick starting characteristic with an increase of power consumption suppressed, even when it is intermittently operated.

As means to achieve this object, an oscillator according to this invention comprises: an oscillating circuit having an oscillating transistor for producing a collector current of a predetermined value at a steady oscillating state; a level monitor for monitoring an output level of the oscillating circuit to produce a control signal in order to increase the collector current to a value larger than the predetermined value before the output level reaches a predetermined level; and a current producing circuit responsive to the control signal from the level monitor for producing a boost current to increase the collector current.

As understood from the above-mentioned structure, this invention is characterized in that the collector current of the oscillating transistor is brought to at an increased value until the output level of the oscillating circuit reaches the predetermined level and that, after the predetermined level is reached, the collector current is decreased to the current value at the steady oscillating state.

Thus, according to this invention, since the collector current of the oscillating transistor can be increased immediately after the power source is supplied to the oscillating circuit, the starting characteristic of the oscillator can be improved. Moreover, since the collector current is decreased to the current value under the steady oscillating state after the output level of the oscillator reaches the predetermined level, the increase of the power consumption can be minimized. As a result, the oscillator according to this invention can achieve the improvement of the starting characteristic, suppressing the increase of its power consumption.

DESCRIPTION OF THE PREFERRED EMBODIMENT

Prior to description of embodiments of this invention, description will be made as to a Colpitts-type crystal oscillator as a conventional oscillator for a better understanding of this invention.

As described above, the Colpitts-type crystal oscillator is the Barkhausen-type oscillator having capacitive reactances between the collector and the emitter and between the base and the emitter, respectively, and an inductive reactance between the collector and the base. Especially, the Colpitts-type crystal oscillator comprises a crystal resonator as the inductive reactance.

Figure 1:
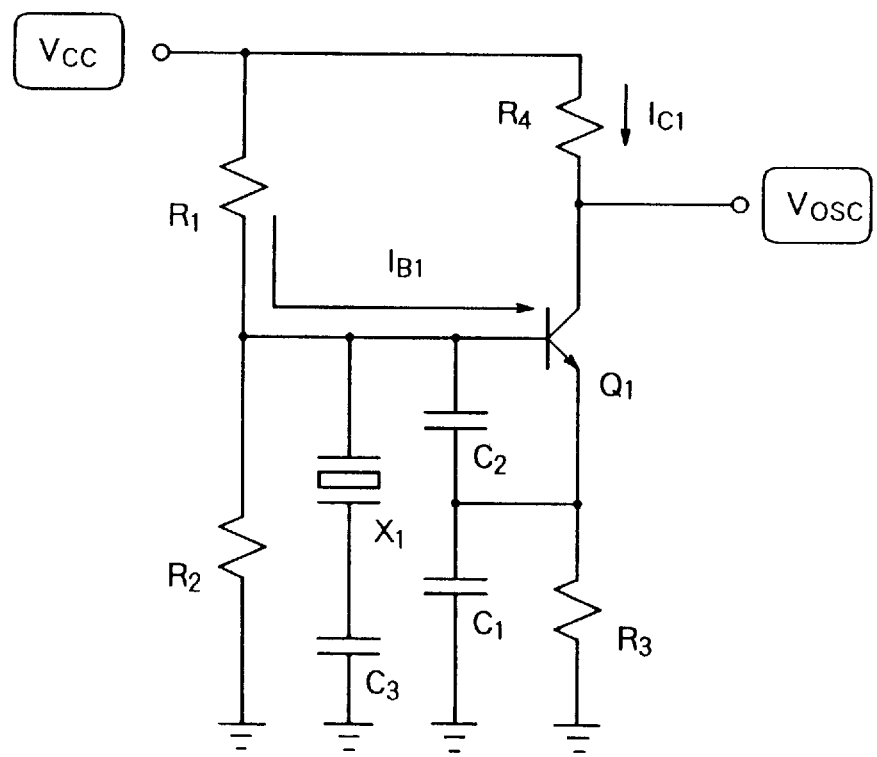
FIG. 1 shows a basic structure of a conventional Colpitts-type crystal oscillating circuit.

Referring to FIG. 1, the conventional Colpitts-type oscillator comprises an oscillating transistor Q1, a capacitor $C_1$, a capacitor $C_2$, a capacitor $C_3$, a crystal resonator $X_1$, and four resistors $R_1$–$R_4$. The capacitor $C_1$ functions as the capacitive reactance between the collector and the emitter. The capacitor $C_2$ functions as the capacitive reactance between the base and the emitter. The series of the crystal resonator $X_1$ and the capacitor $C_3$ has a positive reactance and functions as the inductive reactance between the collector and the base. The two resistors $R_1$ and $R_2$ divide the power source voltage $V_{CC}$. A connection point of the two resistors $R_1$ and $R_2$ is connected to the base of the oscillating transistor Q1. As a result, a base current $I_{B1}$ is determined by resistance values of the two resistors $R_1$ and $R_2$ and flows into the base of the oscillating transistor Q1. The collector of the oscillating transistor Q1 is supplied with a collector current $I_{C1}$ determined by a resistance value of the resistor $R_4$.

This kind of oscillator requires a certain length of a starting time until the oscillator reaches a steady state after the power source is supplied thereto. Description will be made as to the starting time, below.

Figure 2:
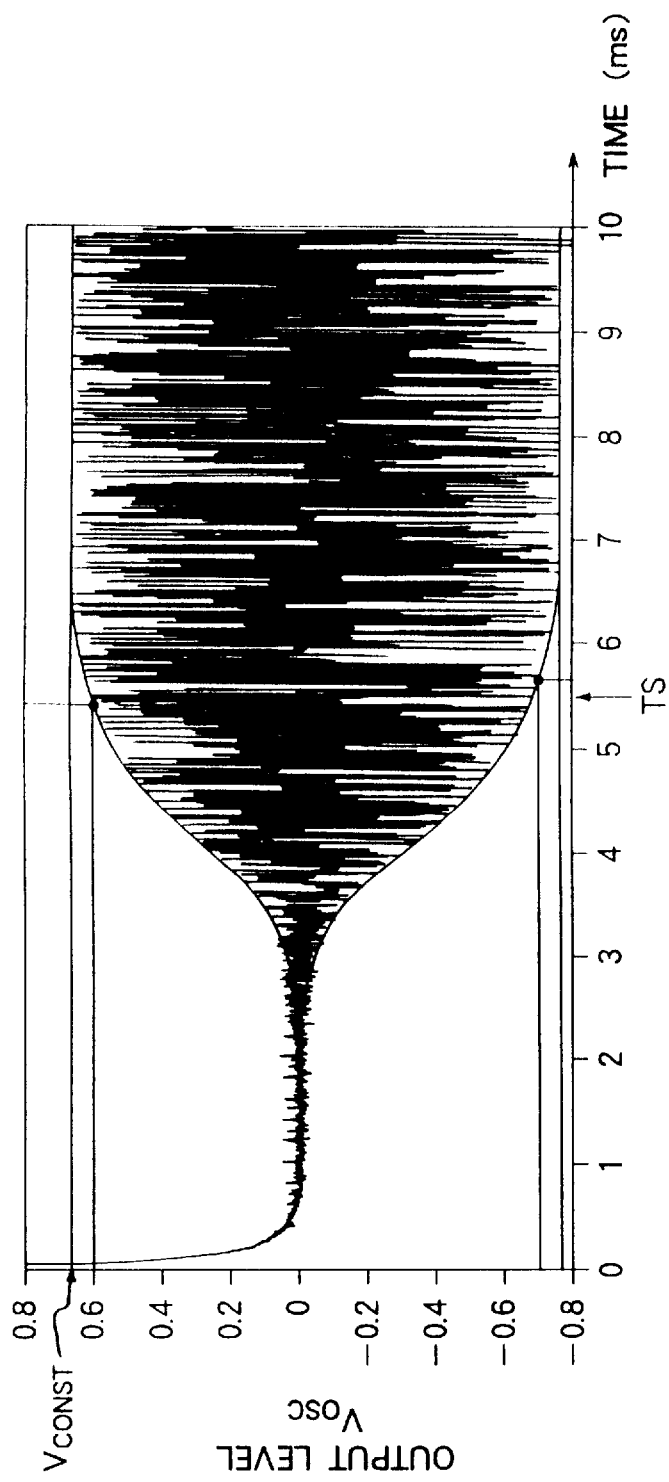
FIG. 2 shows a starting characteristic of a conventional Colpitts-type crystal oscillating circuit.

In the conventional Colpitts-type crystal oscillator, it is supposed that the power source voltage $V_{CC}$, a grounded-emitter current amplification factor β of the oscillating transistor Q1, and the collector current $I_{C1}$ are given by $V_{CC}$=3V, β=180, $I_{C1}$=0.3 mA, respectively. Under the above-mentioned condition, the starting characteristic is illustrated in FIG. 2.

Now, a starting time TS is defined as a time period required for an output (AC voltage) level $V_{OSC}$ of the oscillating circuit Q1 to reach 90% of an output level $V_{CONST}$ of the oscillator at the steady state after the power source is supplied to the oscillator. As understood from FIG. 2, it is apparent that the starting time TS of the conventional oscillator is about 5.5 msec.

Conventionally, it is well known in the art that the collector current $I_{C1}$ of the oscillating transistor Q1 is set to be a large value in order to reduce the starting time TS.

However, if the collector current $I_{C1}$ of the oscillating transistor Q1 is set to the large value so as to improve the starting characteristic of the oscillator, the power consumption of the oscillator is inevitably increased. An application of this oscillator to a battery-driven mobile wireless phone causes a problem that the mobile wireless phone suffers from the short battery life.

On the contrary, an oscillator in accordance with this invention is intended to improve its starting characteristic, suppressing the increase of its power consumption. The oscillator of this invention increases the collector current of the oscillating transistor only until an output level of an oscillating output of an oscillating circuit reaches a predetermined level, then decreases the collector current to a current value of the steady oscillating state after the output level of the oscillating output of the oscillating circuit reaches the predetermined level. Therefore, the power consumption slightly increases indeed, but such increase of the power consumption does not matter in practical use. Preferred embodiments of the oscillator of this invention will be described below with reference to the drawings.

Figure 3:
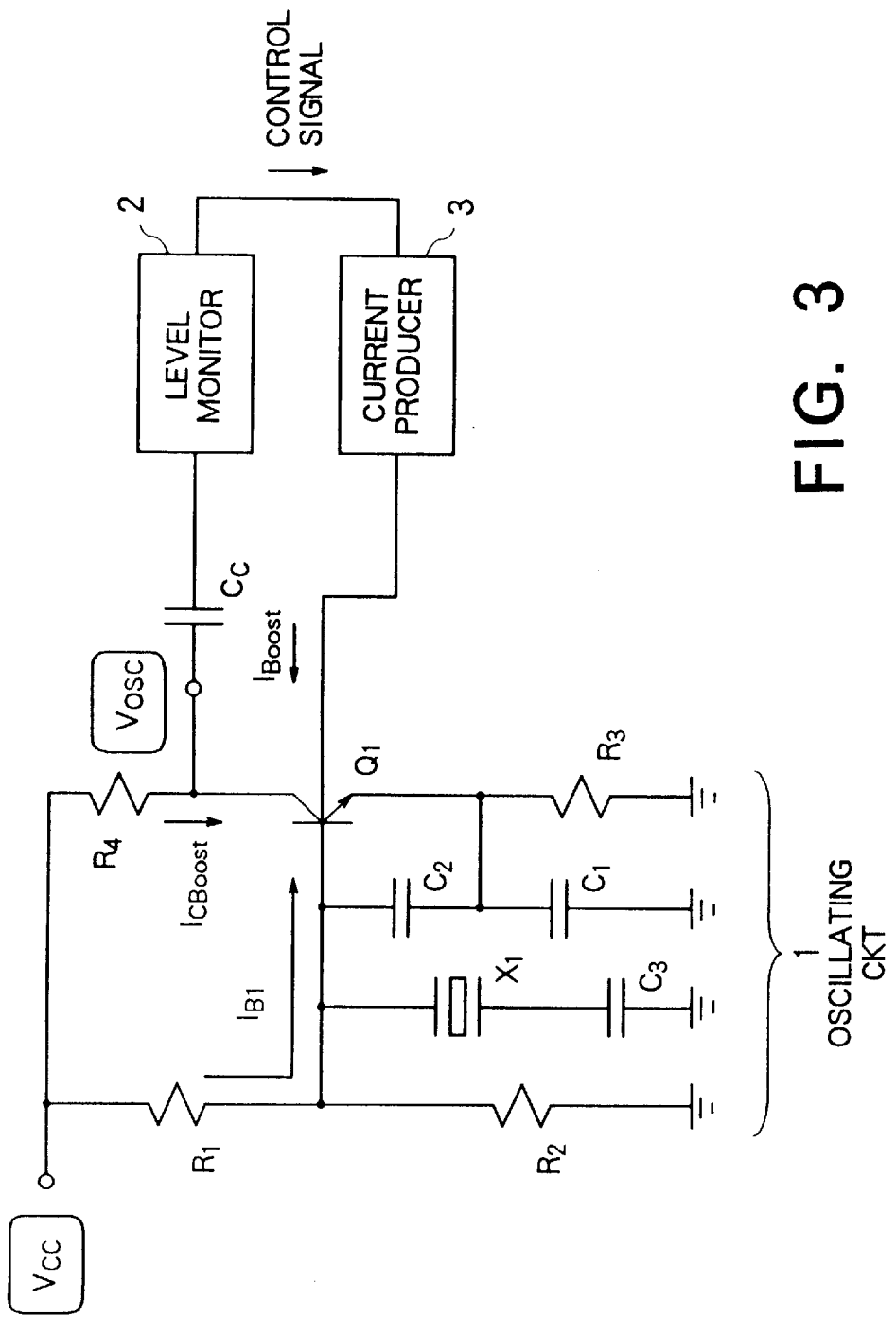
FIG. 3 shows a structure of an oscillator according to a first embodiment of this invention.

Referring to FIG. 3, an oscillator according to the first embodiment of this invention comprises an oscillating circuit 1, a level monitor 2, and a current producer 3.

The oscillating circuit 1 comprises an oscillating transistor Q1, and has a basic circuit structure of the Colpitts-type crystal oscillating circuit.

The level monitor 2 is connected to the oscillating transistor Q1 through a coupling condenser $C_C$, monitors an output level of an oscillator output $V_{OSC}$ of the oscillating circuit 1, produces a control signal, and delivers the control signal to the current producer 3 so as to bring the collector current of the oscillating transistor Q1 to an increased value until the output level reaches the predetermined level.

Figure 4:
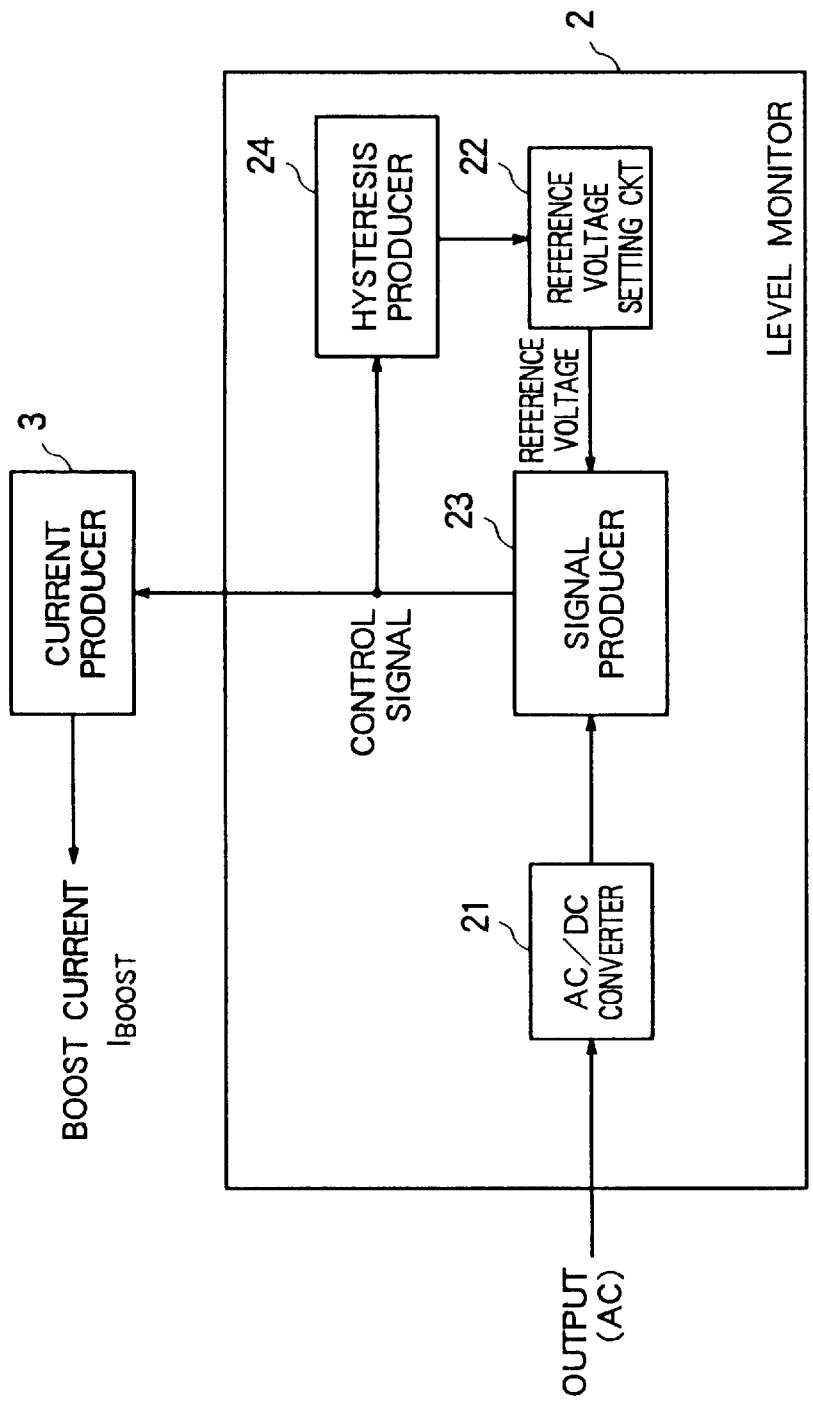
FIG. 4 shows a structure of a level monitor according to a first embodiment of this invention.

Specifically, the level monitor 2 comprises an alternating current-direct current converter (henceforth, AC-DC converter) 21, a reference voltage setting circuit 22, a signal producer 23, and a hysteresis producer 24, as shown in FIG. 4. The AC-DC converter 21 receives the output $V_{OSC}$ of the oscillating circuit 1 and converts the output to an output voltage signal (a DC signal) in proportion to the output VOSC. The reference voltage setting circuit 22 sets up a reference voltage. The reference voltage is initially set to the voltage level equal to that of the output voltage signal when the output level of the oscillating circuit 1 reaches the predetermined level. The predetermined level is, for example, an oscillating level at the steady oscillating state or 90% level of the oscillating level at the steady oscillating state. According to the first embodiment of this invention, the reference voltage setting circuit 22 is provided with a function to set up, as a new reference voltage, a voltage lower than the initial reference voltage by a predetermined voltage value, in response to a signal from the hysteresis producer 24. The signal producer 23 compares a voltage value of the output voltage signal produced by the AC-DC converter 21 with the reference voltage set by the reference voltage setting circuit 22, and delivers the control signal to the current producer 3 when the voltage value of the output voltage signal is lower than a value of the reference voltage. The hysteresis producer 24 checks the control signal delivered from the current producer 23, and makes the reference voltage setting circuit 22 set up, as the reference voltage, a voltage lowered by the predetermined voltage value when the control signal first stops after the power source is supplied to the oscillating circuit 1. Needless to say, the time when the control signal first stops is a time when the voltage value of the output voltage signal first reaches or exceeds the voltage value of the initial reference voltage.

The current producer 3 is responsive to the control signal from the level monitor 2 and produces a boost current $I_{BOOST}$ in order to increase the collector current of the oscillating transistor Q1. In accordance with this embodiment, the collector current of the oscillating transistor Q1 is increased by introducing the boost current $I_{BOOST}$ into the base of the oscillating transistor Q1.

In this embodiment, it is supposed as in the conventional example that the power source voltage $V_{CC}$, a grounded-emitter current amplification factor (of the oscillating transistor Q1, and the collector current $I_{C1}$ are given by $V_{CC}$=3V, β=180, $I_{C1}$=0.3 mA, respectively. Under this condition, the starting characteristic is illustrated in FIG. 5.

Figure 5:
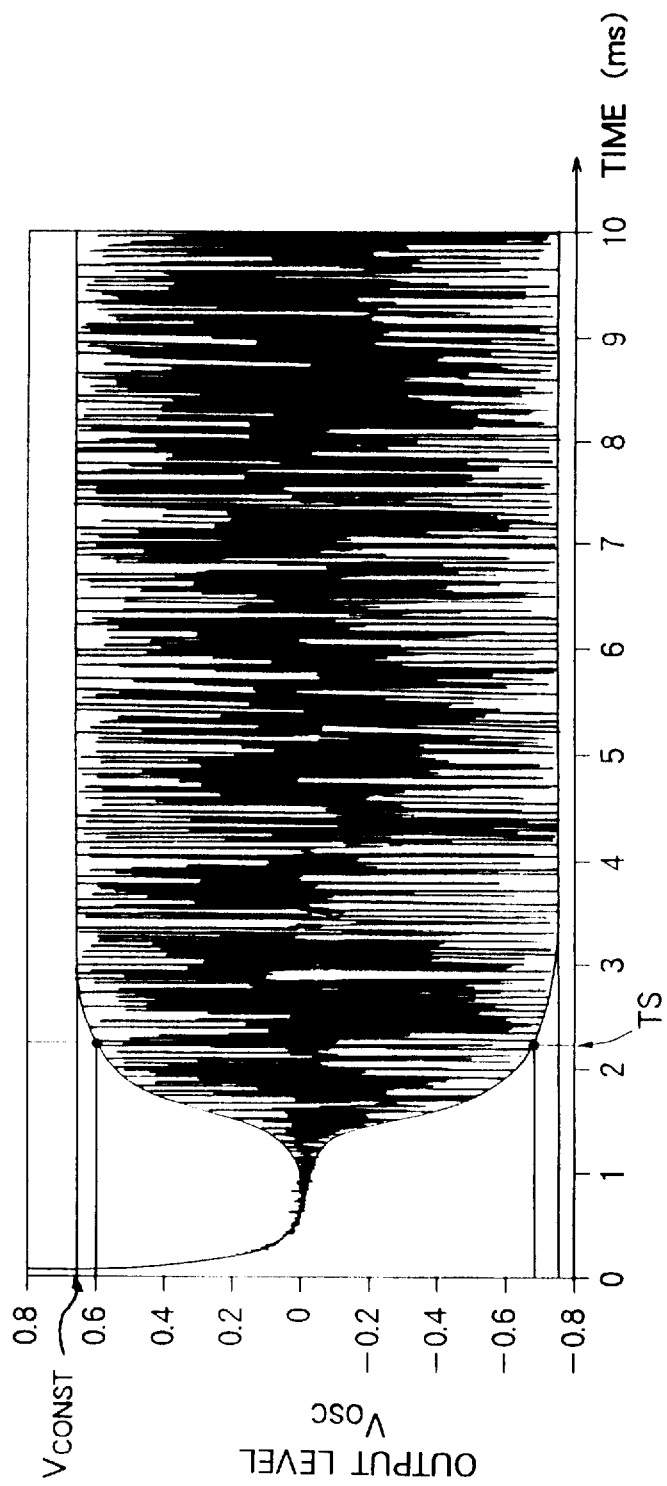
FIG. 5 shows a starting characteristic of an oscillator according to a first embodiment of this invention.

As understood with reference to FIG. 5, the starting time TS is about 2.2 msec. Thus, in accordance with this embodiment, the starting time TS is shortened by about 3.3 msec and is less than half as compared with the conventional example as described above. In this connection, the starting time TS is also defined as a time period required for the level of the output $V_{OSC}$ to reach 90% of the output level $V_{CONST}$ at the steady oscillating state, as described in the conventional example.

As described above, the oscillator according to this embodiment can shorten the starting time by bringing the collector current to an increased level before the output of the oscillating circuit 1 reaches the predetermined level. Moreover, the oscillator according to this embodiment can minimize sacrifice of the low power consumption by decreasing the collector current to the normal collector current after the output of the oscillating circuit 1 reaches the predetermined level. As a result, the oscillator according to this embodiment can shorten the starting time, suppressing the increase of the power consumption.

In addition, the oscillator according to this embodiment comprises the hysteresis producer 24 in the level monitor 2. Thus, the oscillator according to this embodiment can be regulated by the initial reference voltage until the steady oscillating state is first reached after the power source is supplied, and is regulated by the new reference voltage having a lowered voltage value decreased by the predetermined voltage value after the steady oscillating state is first reached. As a result, the oscillator according to this embodiment can avoid an unstable oscillating condition, for example, caused by an undesired operation of the current producer 3 when the oscillating output level slightly goes up or down after the oscillating circuit 1 first reaches the steady oscillating state.

Figure 6:
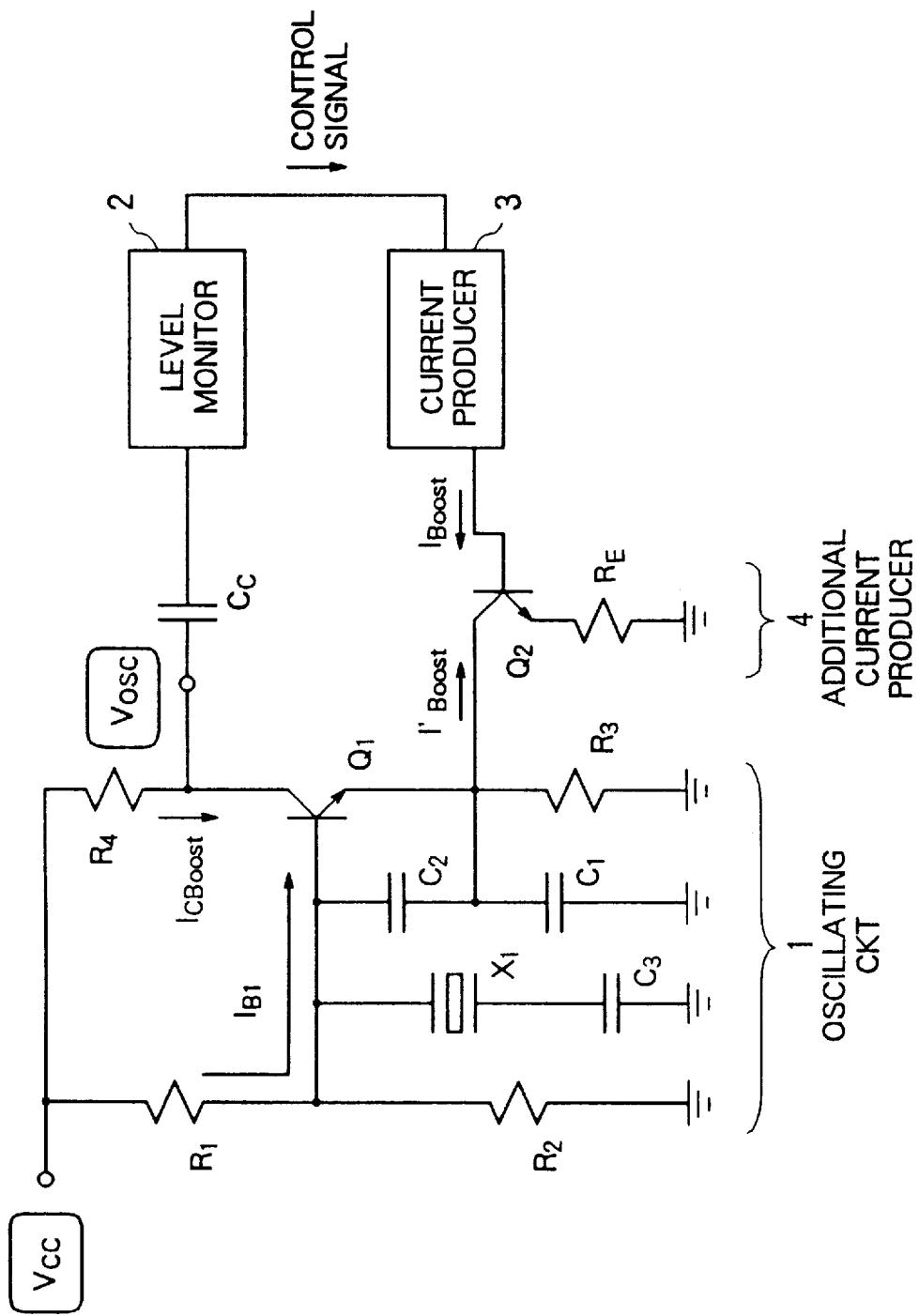
FIG. 6 shows a structure of an oscillator according to a second embodiment of this invention.

Next, the oscillator according to the second embodiment of this invention will be described in conjunction with FIG. 6. As understood from FIG. 6, the second embodiment of this invention is a modification of the above-mentioned first embodiment of this invention. In FIG. 6, components similarly operable to those in FIG. 3 are designated by the same reference numerals.

The oscillator according to this embodiment comprises an oscillating circuit 1, a level monitor 2, and a current producer 3, and an additional current producer 4. The oscillating circuit 1, the level monitor 2, and the current producer 3, operate in the similar manner as those in the above-mentioned first embodiment of this invention.

An additional current producer 4 comprises an additional current producing transistor Q2 and an emitter resistor $R_E$. The additional current producing transistor Q2 produces an additional boost current $I'_{BOOST}$. The additional current producing transistor Q2 has a base connected to the current producer 3, and a collector connected to the emitter of the oscillating transistor Q1. The emitter resistor $R_E$ is connected to an emitter of the additional current producing transistor Q2.

In the oscillator according to this embodiment, the current producer 3 is responsive to the control signal from the level monitor 2 and produces the boost current $I_{BOOST}$. The boost current $I_{BOOST}$ is then supplied to the base of the additional current producing transistor Q2. The additional current producing transistor Q2 is turned on by the boost current $I_{BOOST}$ received at its base. Under this condition, a second boost current $I'_{BOOST}$ is taken from the emitter of the oscillating transistor Q1 into the collector of the additional current producing transistor Q2. As a result, the collector current of the oscillating transistor Q1 increases.

As described above, the oscillator of this invention can bring the collector current of the oscillating transistor to an increased level only before the output level of the oscillating circuit reaches the predetermined level, and can lower the collector current to the current value at the steady oscillating state after the output level reaches the predetermined level. Thus, the oscillator of this invention can shorten the starting time of the oscillator and maintain the low power consumption.

What is claimed is:

1. An oscillator comprising:

an oscillating circuit having an oscillating transistor for producing a collector current having a predetermined value at a steady oscillating state;

a level monitor for monitoring an output level of said oscillating circuit to produce a control signal in order to increase said collector current to a value larger than said predetermined value before said output level reaches a predetermined level; and a current producing circuit responsive to said control signal produced by said level monitor for producing a boost current to increase said collector current.

2. An oscillator as claimed in claim 1, wherein said current producing circuit delivers said boost current to a base of said oscillating transistor to increase said collector current.

3. An oscillator as claimed in claim 1, further comprising an additional current producing transistor means which is for producing an additional boost current and which has a base connected to said current producing circuit and a collector connected to an emitter of said oscillating transistor, said additional curent producing transistor means being responsive to said boost current from said current producing circuit to take said additional boost current from said emitter of said oscillating transistor into said collector of said additional current producing transistor to thereby increase said collector current of said oscillating transistor.

4. An oscillator as claimed in claim 1, wherein said level monitor comprises:

an AC-DC converter for producing an output voltage which is a DC voltage corresponding to the output level;

a reference voltage setting circuit for setting up a reference voltage, said reference voltage having a voltage value equal to said output voltage from said AC-DC converter when said output level reaches said predetermined level; and a signal producer for comparing said output voltage with said reference voltage to produce said control signal when said output voltage is lower than said reference voltage, said control signal being delivered to said current producing circuit.

5. An oscillator as claimed in claim 4, wherein said level monitor further comprises a hysteresis producer connected to said signal producer for making said reference voltage setting circuit set a new reference voltage which is lowered by a predetermined voltage value when said control signal is first stopped after said oscillating circuit is supplied with a power source.

6. An oscillator as claimed in claim 1, wherein said oscillating circuit is a Colpitts-type oscillating circuit.

7. An oscillator as claimed in claim 1, wherein said oscillating circuit is a crystal oscillating circuit having a crystal resonator.

* * * * *